(12) United States Patent
Saunders (10) Patent No.: US 8,737,531 B2
(45) Date of Patent: May 27, 2014

(54) VECTOR GENERATOR USING OCTANT SYMMETRY

(75) Inventor: David R. Saunders, Scottsdale, AZ (US)

(73) Assignee: ViaSat, Inc., Carlsbad, CA (US)

( * ) Notice: Subject to any disclaimer, the term of this patent is extended or adjusted under 35 U.S.C. 154(b) by 0 days.

(21) Appl. No.: 13/306,503

(22) Filed: Nov. 29, 2011

(65) Prior Publication Data
US 2013/0135022 A1    May 30, 2013

(51) Int. Cl.
*H03C 1/52*    (2006.01)

(52) U.S. Cl.
USPC .......................................... 375/300; 375/295

(58) Field of Classification Search
USPC .......................................................... 375/295
See application file for complete search history.

(56) References Cited

U.S. PATENT DOCUMENTS

| | | | |
|---|---|---|---|
| 3,119,965 A | 1/1964 | Phillips | |
| 4,857,777 A | 8/1989 | Altes | |
| 4,896,374 A | 1/1990 | Waugh et al. | |
| 4,965,602 A | 10/1990 | Kahrilas et al. | |
| 4,994,773 A | 2/1991 | Chen et al. | |
| 5,045,822 A | 9/1991 | Mohwinkel | |
| 5,270,719 A | 12/1993 | Roth | |
| 5,848,060 A | 12/1998 | Dent | |
| 5,907,815 A | 5/1999 | Grimm et al. | |
| 5,942,929 A | 8/1999 | Aparin | |
| 5,966,049 A | 10/1999 | Yuen et al. | |
| 6,005,515 A | 12/1999 | Allen et al. | |
| 6,061,553 A | 5/2000 | Matsuoka et al. | |
| 6,232,837 B1 | 5/2001 | Yoo et al. | |
| 6,326,845 B1 | 12/2001 | Miyaji et al. | |
| 6,411,824 B1 | 6/2002 | Eidson | |
| 6,424,281 B1 * | 7/2002 | Liaw et al. | 341/144 |
| 7,098,859 B2 | 8/2006 | Shimawaki et al. | |
| 7,319,345 B2 | 1/2008 | Farjad-rad et al. | |
| 7,355,470 B2 | 4/2008 | Sorrells et al. | |
| 7,378,902 B2 | 5/2008 | Sorrells et al. | |

(Continued)

FOREIGN PATENT DOCUMENTS

| | | |
|---|---|---|
| EP | 0762660 | 3/1997 |
| EP | 1193861 | 4/2002 |

(Continued)

OTHER PUBLICATIONS

Kwang-Jin, Koh, Gabriel M. Rebeiz, 0.13-mu m CMOS phase shifters for X-, Ku, and K-band phased arrays, IEEE Journal of Solid State Circuits, 2007, 14 pages.

(Continued)

*Primary Examiner* — Santiago Garcia
(74) *Attorney, Agent, or Firm* — Snell & Wilmer L.L.P.

(57) ABSTRACT

In various embodiments, an active vector generator may comprise a vector component switch and a first amplitude adjustment component in parallel with a second amplitude adjustment component. The first and second amplitude adjustment components may operate with different ranges of amplitude. For example, the first amplitude adjustment component may have a full range of amplitude and the second amplitude adjustment component may have a partial range of amplitude. The vector component switch may operate to receive two signals and route the signals to the various amplitude adjustment components based on the relative magnitudes of the two signals. A benefit of having two amplitude adjustment components with selectable signal pathways is that the all the phase states may be obtained but using less robust and expensive amplitude adjustment components.

13 Claims, 4 Drawing Sheets

(56) References Cited

U.S. PATENT DOCUMENTS

| | | | |
|---|---|---|---|
| 7,400,193 | B2 | 7/2008 | Wyatt |
| 7,408,507 | B1 | 8/2008 | Paek et al. |
| 7,420,423 | B2 | 9/2008 | Lee et al. |
| 7,421,036 | B2 | 9/2008 | Sorrells et al. |
| 7,436,370 | B2 | 10/2008 | Blanton |
| 7,620,129 | B2 | 11/2009 | Sorrells et al. |
| 7,672,653 | B2 | 3/2010 | Cowley et al. |
| 7,728,784 | B2 | 6/2010 | Mohamadi |
| 7,746,764 | B2 | 6/2010 | Rawlins et al. |
| 7,750,733 | B2 | 7/2010 | Sorrells et al. |
| 7,755,430 | B2 | 7/2010 | Imagawa |
| 7,885,682 | B2 | 2/2011 | Sorrells et al. |
| 8,013,784 | B2 | 9/2011 | Margomenos et al. |
| 8,160,530 | B2* | 4/2012 | Corman et al. ............ 455/276.1 |
| 2002/0113648 | A1* | 8/2002 | Miyaji et al. .................. 330/151 |
| 2003/0016085 | A1 | 1/2003 | Yamazaki |
| 2003/0162566 | A1 | 8/2003 | Shapira et al. |
| 2004/0095190 | A1 | 5/2004 | Klaren |
| 2004/0121750 | A1 | 6/2004 | Nation |
| 2004/0229584 | A1 | 11/2004 | Fischer et al. |
| 2005/0113052 | A1 | 5/2005 | Rabinovich et al. |
| 2005/0151698 | A1 | 7/2005 | Mohamadi |
| 2006/0170499 | A1 | 8/2006 | Rahman et al. |
| 2007/0248186 | A1 | 10/2007 | Sorrells et al. |
| 2007/0275674 | A1 | 11/2007 | Chien |
| 2007/0279061 | A1* | 12/2007 | Erickson et al. .............. 324/322 |
| 2007/0280384 | A1 | 12/2007 | Hidaka |
| 2008/0129408 | A1 | 6/2008 | Nagaishi et al. |
| 2008/0129634 | A1 | 6/2008 | Pera |
| 2008/0218424 | A1 | 9/2008 | Blanton |
| 2009/0086851 | A1 | 4/2009 | Rofougaran |
| 2009/0091384 | A1 | 4/2009 | Sorrells et al. |
| 2010/0039174 | A1 | 2/2010 | Teetzel |
| 2010/0073085 | A1 | 3/2010 | Sorrells et al. |
| 2010/0097138 | A1* | 4/2010 | Sorrells et al. ................ 330/149 |
| 2010/0225389 | A1* | 9/2010 | Teetzel ......................... 330/149 |
| 2010/0260285 | A1* | 10/2010 | Corman et al. ............... 375/295 |
| 2010/0321107 | A1* | 12/2010 | Honcharenko ........... 330/124 R |
| 2013/0058382 | A1* | 3/2013 | Matsuura ...................... 375/219 |

FOREIGN PATENT DOCUMENTS

| | | |
|---|---|---|
| JP | 09326629 | 12/1997 |
| JP | 2003168938 | 6/2003 |
| JP | 2003229738 | 8/2003 |
| WO | 99/45609 | 8/1999 |
| WO | 0003456 | 1/2000 |
| WO | 02/41442 | 5/2002 |
| WO | 03/036756 | 5/2003 |
| WO | 2008126985 | 10/2008 |
| WO | 2009043917 | 4/2009 |

OTHER PUBLICATIONS

Kwang-Jin, Koh, Jason W. May, Gabriel M. Rebeiz A Q-Band (40-45 GHz) 16-Element Phased-Array Transmitter in 0.18-βm SiGe BiCMOS Technology, IEEE Radio Frequency Integrated Circuits Symposium, 2008, 4 pages.
Kwang-Jin, Koh, Gabriel M. Rebeiz, An X- and Ku-Band 8-Element Phased-Array Receiver in 0.18-βm SiGe BiCMOS Technology, IEEE Journal of Solid State Circuits, Jun. 2008, 12 pages.
Tokumitsu et al.—Active isolator, combiner, divider and magic-T as miniaturized function blocks dated Nov. 6, 1998, pp. 273-276.
Aminghasem Safarian et al., "Distributed Active Power Combiners and Splitters for Multi-Antenna UWB Transceivers" Sep. 2006, pp. 138-141.
Viallon et al. "An Original SiGe Active Differential Output Power Splitter for MMW Application" 2003, 4 pages.
Hsiao "Analysis of Interleaved Arrays of Waveguide Elements" IEEE Transactions on Antennas and Propadation, vol. AP-19, No. 6 Nov. 1971, pp. 729-735.
Zheng et al., "Full 360 degree Vector-Sum Phase-Shifter for Microwave System Applications," IEEE Transactions on Circuits and Systems I: Regular Papers, Downloaded on Jul. 8, 2009, pp. 1-7.
Ayari et al., "Automatic Test Vector Generation for Mixed-Signal Circuits," 1995, Ecole Polytechnique of the University of Montreal, 6 pages.
Strassberg, Dan, "RF-vector-signal generator combines high throughput, low phase noise," EDN, Oct. 6, 2009, 2 pages, UBM Electronics.
International Search Report and Written Opinion dated Jul. 19, 2010 from PCT US10/030881.
International Search Report and Written Opinion dated Aug. 23, 2010 from PCT US10/030864.
International Search Report and Written Opinion dated Oct. 27, 2010 from PCT US10/030876.
International Search Report and Written Opinion dated Nov. 18, 2010 from PCT/US10/30871.
International Search Report and Written Opinion dated Nov. 26, 2010 from PCT/US10/30868.
International Search Report and Written Opinion dated Nov. 26, 2010 from PCT/US10/30877.
International Search Report and Written Opinion dated Nov. 26, 2010 from PCT/US/30866.
International Search Report and Written Opinion dated Nov. 26, 2010 from PCT/US10/30892.
International Search Report and Written Opinion dated Nov. 30, 2010 from PCT/US10/30906.
International Search Report and Written Opinion dated Nov. 26, 2010 from PCT/US10/30872.
Office Action dated Apr. 7, 2011 in U.S. Appl. No. 12/759,064.
International Preliminary Report on Patentability dated Jul. 21, 2011 from PCT/US2010/030877.
International Preliminary Report on Patentability dated Jul. 21, 2011 from PCT/US10/30906.
International Preliminary Report on Patentability dated Jul. 20, 2011 from PCT/US10/30892.
Notice of Allowance dated Jul. 27, 2011 in U.S. Appl. No. 12/759,064.
Office Action dated Sep. 29, 2011 in U.S. Appl. No. 12/759,059.
International Preliminary Report on Patentability dated Oct. 27, 2011 from PCT US10/030864.
International Preliminary Report on Patentability dated Oct. 27, 2011 from PCT/US10/30868.
International Preliminary Report on Patentability dated Oct. 27, 2011 from PCT US10/030881.
International Preliminary Report on Patentability dated Oct. 27, 2011 from PCT/US10/30872.
International Preliminary Report on Patentability dated Oct. 27, 2011 from PCT/US10/30871.
International Preliminary Report on Patentability dated Oct. 27, 2011 from PCT/US/30866.
International Preliminary Report on Patentability dated Oct. 27, 2011 from PCT US10/030876.
Office Action dated Jan. 4, 2012 from U.S. Appl. No. 12/759,148.
Office Action dated Feb. 27, 2012 in U.S. Appl. No. 12/759,130.
Notice of Allowance dated Feb. 28, 2012 in U.S. Appl. No. 12/759,059.
Office Action dated May 7, 2012 in U.S. Appl. No. 12/759,113.
Office Action dated Feb. 20, 2013 in U.S. Appl. No. 13/412,901.
Office Action dated Aug. 2, 2012 in U.S. Appl. No. 12/758,996.
Notice of Allowance dated May 10, 2012 in U.S. Appl. No. 12/759,130.
Office Action dated May 17, 2012 in U.S. Appl. No. 12/759,043.
Supplemental Notice of Allowability dated May 29, 2012 in U.S. Appl. No. 12/759,130.
Office Action dated May 29, 2012 in U.S. Appl. No. 12/759,123.
Final Office Action dated Jun. 5, 2012 in U.S. Appl. No. 12/759,148.
Supplemental Notice of Allowability dated Jun. 11, 2012 in U.S. Appl. No. 12/759,130.
Notice of Allowance dated Aug. 14, 2012 in U.S. Appl. No. 12/759,123.
Notice of Allowance dated Aug. 20, 2012 in U.S. Appl. No. 12/759,148.
Office Action dated Aug. 21, 2012 in U.S. Appl. No. 12/759,113.
Final Office Action dated Sep. 17, 2012 in U.S. Appl. No. 12/759,043.

(56) References Cited

OTHER PUBLICATIONS

Notice of Allowance dated Nov. 8, 2012 in U.S. Appl. No. 12/759,043.
Notice of Allowance dated Nov. 6, 2013 in U.S. Appl. No. 13/306,937.
Notice of Allowance dated Dec. 6, 2012 in U.S. Appl. No. 13/540,394.
Office Action dated Dec. 19, 2012 in U.S. Appl. No. 12/758,914.
Notice of Allowance dated Dec. 21, 2012 in U.S. Appl. No. 12/759,113.
Notice of Allowance dated Jan. 30, 2013 in U.S. Appl. No. 12/758,996.
Office Action dated May 21, 2013 in U.S. Appl. No. 12/759,112.
Notice of Allowance dated Jul. 5, 2013 in U.S. Appl. No. 12/758,914.
Office Action dated Jul. 9, 2013 in U.S. Appl. No. 13/306,937.
Notice of Allowance dated Aug. 29, 2013 in U.S. Appl. No. 13/412,901.
Notice of Allowance dated Sep. 3, 2013 in U.S. Appl. No. 13/692,683.
Office Action dated Sep. 6, 2013 in U.S. Appl. No. 12/759,112.
Office Action dated Sep. 24, 2013 in U.S. Appl. No. 13/771,884.
Notice of Allowance dated Nov. 26, 2013 in U.S. Appl. No. 13/692,683.
Office Action dated Oct. 25, 2013 in Japanese Application No. 2012-506127.
Office Action dated Oct. 29, 2013 in Japanese Application No. 2012-506132.
Search Report dated Dec. 12, 2013 in European Application No. 10765025.1.
Office Action dated Jan. 9, 2014 in U.S. Appl. No. 12/759,112.
Notice of Allowance dated Jan. 10, 2014 in U.S. Appl. No. 13/771,884.

* cited by examiner

VECTOR GENERATOR USING OCTANT SYMMETRY

BACKGROUND

Typical phase shifters have various limitations, such as discrete components that take up space, fixed frequency operation, and the size is frequency dependent. Moreover, one type of phase shifter, a vector modulator, typically includes banks of binary weighted attenuators or current sources. The binary weighted attenuators or current sources may generate discrete steps in amplitudes of two orthogonal components of the input signal to control a phase shift. The dynamic ranges of the two orthogonal components, namely the in-phase vector component and the quadrature phase vector component, are the same. Correspondingly, the in-phase component amplitude over the phase range from 0-45° is identical to the amplitudes used for the quadrature-phase component over the phase range from 90-45°. Similarly, the in-phase component over the range of 45-90° is identical to the amplitudes used for the quadrature-phase component over the phase range from 45-0°.

SUMMARY

A vector generator is configured to adjust the phase of an input signal and generate a phase-adjusted resultant composite vector. In various embodiments, an active vector generator may comprise a vector component switch and a first amplitude adjustment component in parallel with a second amplitude adjustment component. Furthermore, in another example, an active vector generator may further comprise a 90° splitter configured to receive an input signal and output two signals with a relative 90° phase difference, as well as a first inverter switch in parallel with a second inverter switch, and a combiner configured to receive the adjusted signals from both the first and second amplitude adjustment components.

The first and second amplitude adjustment components may operate with different ranges of amplitude. For example, the first amplitude adjustment component may have a full range of amplitude capabilities and the second amplitude adjustment component may have a partial range of amplitude capabilities. More specifically, in various embodiments, the partial range amplitude capabilities of the second amplitude adjustment component may be $$\frac{\sqrt{2}}{2}$$

of the full amplitude range of the first amplitude adjustment component. In another example, the first amplitude adjustment component may have a high range of amplitude capabilities, such as $$\frac{\sqrt{2}}{2}$$

to 1, and the second amplitude adjustment component may have a low range of amplitude capabilities, such as 0 to $$\frac{\sqrt{2}}{2}.$$

The vector component switch may operate to receive the first and second inverter output signals and route the first inverter signal to either the first amplitude adjustment component or the second amplitude adjustment component. Further, the vector component switch may be configured to route the second inverter signal to the first amplitude adjustment component or the second amplitude adjustment component that does not receive the first inverter signal. The determination of the route of the first inverter signal and the route of the second inverter signal may be based on the relative magnitudes of the first inverter signal and the second inverter signal.

A benefit of having two amplitude adjustment components with selectable signal pathways is that the all the phase states may be obtained but using less robust and expensive amplitude adjustment components. A decrease in dynamic range of the amplitude adjustment component may reduce the number of attenuators or current sources.

BRIEF DESCRIPTION OF THE DRAWING FIGURES

A more complete understanding of the present invention may be derived by referring to the detailed description and claims when considered in connection with the drawing figures, and:

DETAILED DESCRIPTION

While various embodiments are described herein in sufficient detail to enable those skilled in the art to practice the invention, it should be understood that other embodiments may be realized and that logical, electrical, and mechanical changes may be made without departing from the spirit and scope of the invention. Thus, the following detailed description is presented for purposes of illustration only.

Figure 1A:
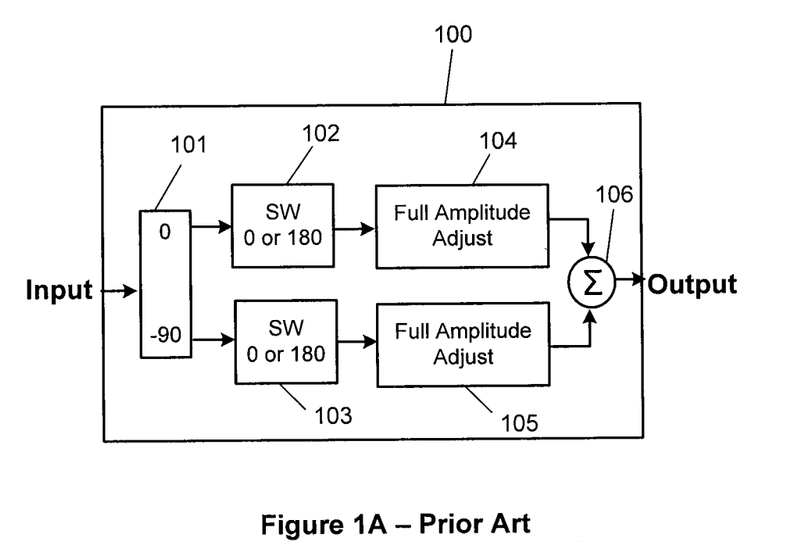
FIG. 1A illustrates a block diagram of a prior art vector generator.

With reference to FIG. 1A, a prior art vector generator 100 may comprise a 90° splitter 101, a first inverter switch 102 in parallel with a second inverter switch 103, a first full amplitude adjustment variable gain amplifier (VGA) 104 in parallel with a second full amplitude adjustment VGA 105, and a combiner 106 to receive the adjusted signals from both the first and second full amplitude adjustment VGAs 104, 105. Vector generator 100 is configured to adjust the phase of an input signal and generate a phase-adjusted output signal.

In typical operation, vector generator 100 may receive an input signal at 90° splitter 101. The 90° splitter 101 may be configured to output two signals with a relative 90° phase difference. One of the two signals outputted from 90° splitter 101 may be communicated to first inverter switch 102 and the other of the two signals outputted from 90° splitter 101 may be communicated to second inverter switch 103. First inverter switch 102 and second inverter switch 103 may each be a 180° switch configured to invert a signal in order to determine the appropriate quadrant of the resultant composite vector. Further, first inverter switch 102 may transmit a first inverter output signal to first full amplitude adjustment VGA 104. Similarly, second inverter switch 103 may transmit a second inverter output signal to second full amplitude adjustment VGA 105.

Full amplitude adjustment VGAs 104, 105 may be configured to adjust the amplitude of a vector signal to the appropriate magnitude. The appropriate magnitude may be based on the desired phase of a composite output vector. As is known by one skilled in the art, the phase of the composite output vector in an I/Q vector generator is determined by the magnitudes of the in-phase (I) vector and the quadrature-phase (Q) vector relative to each other. Each of full amplitude adjustment VGAs 104, 105 are capable of a full range of amplitude of the vector signal. For example, the range of a vector component may be from zero magnitude to the full magnitude of the resultant composite vector. The resultant composite vector may be generated by combiner 106 receiving and combining a first vector from first full amplitude adjustment VGA 104 and a second vector from second full amplitude adjustment VGA 105.

Figure 1B:
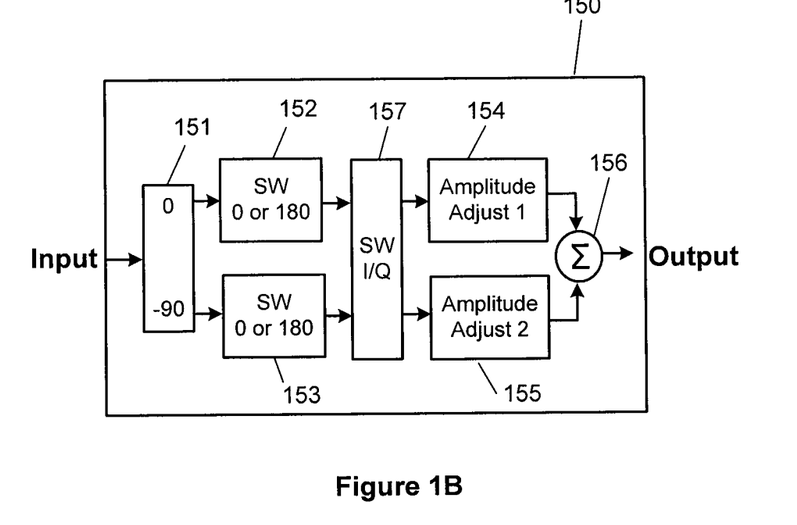
FIG. 1B illustrates an example of a block diagram of a vector generator embodiment.

With reference to FIG. 1B and in various embodiments, an active vector generator 150 may comprise a 90° splitter 151, a first inverter switch 152 in parallel with a second inverter switch 153, a vector component switch 157, a first amplitude adjustment component 154 in parallel with a second amplitude adjustment component 155, and a combiner 156 configured to receive the adjusted signals from both the first and second amplitude adjustment components 154, 155. Vector generator 150 may be configured to adjust the phase of an input signal and generate a phase-adjusted output signal.

The exact order of first and second inverter switch 152, 153, vector component switch 157, and first and second amplitude adjustment components 154, 155 may be designed in various ways. For instance, the vector component switch 157 may be located before or after inverter switches 152, 153, or before or after first and second amplitude adjustment components 154, 155. In other words, vector component switch 157 may be located as desired at various points after 90° splitter 151 and before combiner 156 in active vector generator 150.

In one example of operation, vector generator 150 may receive an input signal at 90° splitter 151. The 90° splitter 151 may be configured to output two signals with a relative 90° phase difference. One of the two signals outputted from 90° splitter 151 may be communicated to first inverter switch 152 and the other of the two signals outputted from 90° splitter 151 may be communicated to second inverter switch 153. First inverter switch 152 and second inverter switch 153 may each be a 180° switch configured to invert a signal in order to determine the appropriate quadrant of a resultant composite vector. In another example, first inverter switch 152 and second inverter switch 153 may each be one of a switched amplifier with a gain of −1, switched transmission lines with 180° phase difference, or switched rat-race couplers. Further, first inverter switch 152 may transmit a first inverter output signal to vector component switch 157 and, similarly, second inverter switch 153 may transmit a second inverter output signal to vector component switch 157. Vector component switch 157 receives the first and second inverter output signals and may transmit the first inverter output signal to either first amplitude adjustment component 154 or second amplitude adjustment component 155. The second inverter output signal may be transmitted to the amplitude adjustment component that does not receive the first inverter output signal.

For example, if the first inverter output signal is transmitted to second amplitude adjustment component 155, then the second inverter output signal is transmitted to first amplitude adjustment component 154.

Two separate and different amplitude adjustment components 154, 155 may be part of active vector generator 150. The amplitude adjustment components 154, 155 may be a suitable component, or combination of components that facilitate variable path gain. For example, amplitude adjustment components 154, 155 may individually comprise various electronic components, such as at least one VGA or at least one switched variable attenuator. Use of a switched variable attenuator may be coupled with a fixed gain amplifier to compensate for the loss caused by the attenuator. In contrast, a VGA may be configured to provide a gain and may not include additional gain compensation. Both a VGA and a switched variable attenuator may be configured to provide similar performance, such as gain, noise, or linearity. Moreover, in various examples, a fixed gain amplifier with attenuators may provide greater operational bandwidth than a VGA. However, a VGA configuration may be more compact than a switched variable attenuator configuration. Additionally, in one example, first amplitude adjustment component 154 may have full range of amplitude control and second amplitude adjustment component 155 may only have a partial range of amplitude control relative to first amplitude adjustment component 154. In another example, first amplitude adjustment component 154 may have a high partial range of amplitude control, such as from 0.707 to 1, and second amplitude adjustment component 155 may have a low partial range of amplitude control, such as 0 to 0.707. The first and second inverter output signals are the I and Q vector components of the input signal. First and second inverter output signals may be appropriately routed to either the first or second amplitude adjustment components 154, 155 based on the octant of the phase state of the desired composite vector.

By way of illustration, assume first amplitude adjustment component 154 has larger amplitude output capabilities than second amplitude adjustment component 155. For example, first amplitude adjustment component may have full amplitude capabilities and second amplitude adjustment component 155 may have an amplitude capabilities that are $$\frac{\sqrt{2}}{2}$$

of the full amplitude capabilities. In this example, if the I vector component has the larger amplitude of the composite vector, then the I vector component may be routed through first amplitude adjustment component 154 and the Q vector component may be routed through the second amplitude adjustment component 155. Conversely, if the Q vector component of the composite vector has the larger amplitude, then the Q vector component may be routed through first amplitude adjustment component 154 and the I vector component may be routed through second amplitude adjustment component 155. In various embodiments, the two outputs of inverter switches 152, 153 are selectively provided to the two amplitude adjustment components 154, 155 such that the output that has the larger signal amplitude is provided to the amplitude adjustment component having the larger amplitude capabilities.

To illustrate another example, assume first amplitude adjustment component 154 has higher range amplitude output capabilities than second amplitude adjustment component 155. For example, first amplitude adjustment component 154 may have a high partial range of amplitude control, such as from $$\frac{\sqrt{2}}{2}$$

to 1 and second amplitude adjustment component 155 may have a low partial range of amplitude control, such as 0 to $$\frac{\sqrt{2}}{2}.$$

In this example, if the I vector component has the larger amplitude of the composite vector, then the I vector component may be routed through first amplitude adjustment component 154 and the Q vector component may be routed through the second amplitude adjustment component 155. Conversely, if the Q vector component of the composite vector has the larger amplitude, then the Q vector component may be routed through first amplitude adjustment component 154 and the I vector component may be routed through second amplitude adjustment component 155. In various embodiments, the two outputs of inverter switches 152, 153 are selectively provided to the two amplitude adjustment components 154, 155 such that the output that has the larger signal amplitude is provided to the amplitude adjustment component having the high range of amplitude capabilities.

Figure 2:
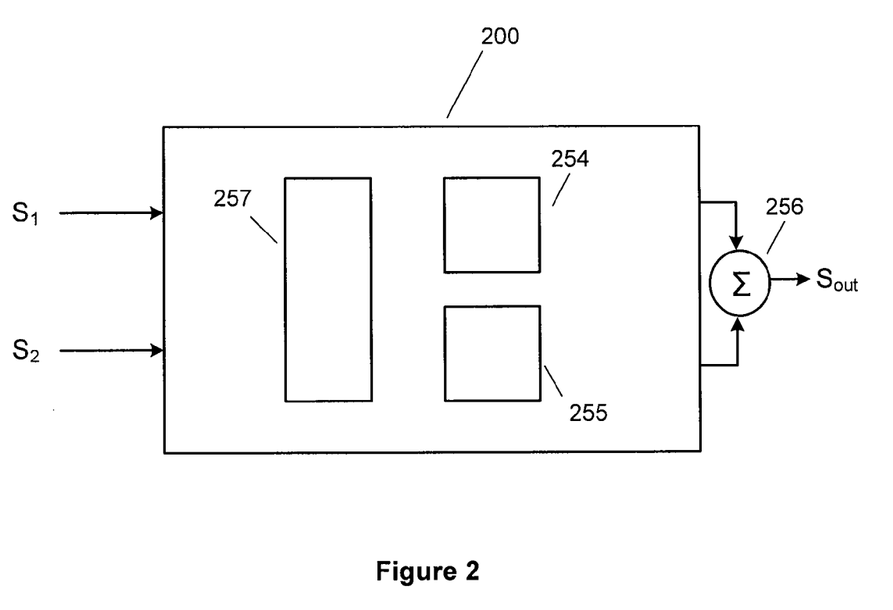
FIG. 2 illustrates an example of a vector switching module embodiment.

With reference to FIG. 2, a vector switching module 200 may be configured to receive two input signals $S_1$, $S_2$. Input signals $S_1$ and $S_2$ may be I and Q vector components, respectively. Conversely, input signal $S_1$ may be the Q vector component and input signal $S_2$ may be the I vector component. Input signals $S_1$, $S_2$ are processed by vector switching module 200 and the processed signals may be combined by a combiner 256. Combiner 256 is configured to generate a composite output signal $S_{out}$. In one example, input signals $S_1$, $S_2$ may be processed for quadrant selection prior to communication to vector switching module 200. In another example, input signals $S_1$, $S_2$ may be processed for quadrant selection after communication to vector switching module 200 but prior to transmission to combiner 256.

By way of example and with continued reference to FIG. 2, vector switching module 200 may comprise a first amplitude adjustment module 254 in parallel with a second amplitude adjustment module 255, and a vector component switch 257. Vector switching module 200 may be part of active vector generator 150, and may replace some of the functionality previously described. Vector component switch 257 may be electrically in communication with first and second amplitude adjustment modules 254, 255 either before or after signals are processed by first and second amplitude adjustment modules 254, 255. One of amplitude adjustment modules 254, 255 may have full amplitude capabilities and the other amplitude adjustment module may have partial amplitude capabilities. In one embodiment, input signal $S_1$ may be provided to first amplitude adjustment module 254 and input signal $S_2$ may be provided to second amplitude adjustment module 255 for a particular phase shift and vice versa for a different phase shift. The outputs of first and second amplitude adjustment modules 254, 255 may be provided as the outputs of vector switching module 200 to combiner 256. In another embodiment, input signal $S_1$ may be provided to first amplitude adjustment module 254 and input signal $S_2$ may be provided to second amplitude adjustment module 255, and the outputs of first and second amplitude adjustment modules 254, 255 may be provided to vector component switch 257. Further, the outputs of vector component switch 257 may be the outputs of vector switching module 200 and provided to combiner 256.

Vector component switch 257 may be configured to provide the signal corresponding to the larger magnitude of I and Q vector components to the amplitude adjustment module that has the larger or higher range of amplitude capability. Correspondingly, vector component switch 257 may be configured to provide the signal corresponding to the smaller magnitude of I and Q vector components to the amplitude adjustment module that has the partial or lower range of amplitude capability. The magnitude of the I and Q vector components is determined by the magnitude of each vector component relative to one another when combined to form the resultant composite vector. Further, selection of the desired phase state and corresponding resultant composite vector is based on a phase shift to be applied to an input signal. In other words, selection of a desired phase shift determines the quadrant and octant of the resultant composite vector. In various embodiments, a controller (not shown) may determine, based on the desired phase shift, the magnitude of each vector component when combined to form the resultant composite vector.

Figure 3:
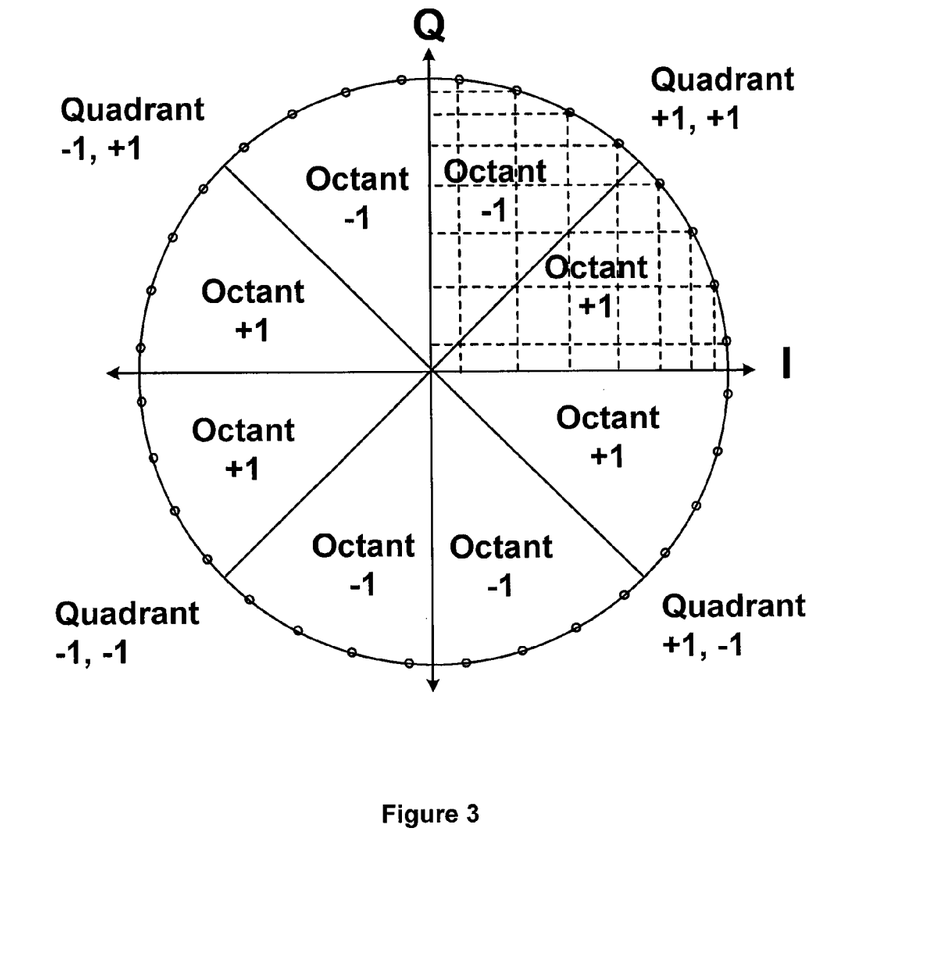
FIG. 3 illustrates an example of a quadrant phase diagram of a vector generator.

In accordance with various embodiments and with reference to FIG. 3, an active vector generator may be configured to adjust the phase of a signal. The active vector generator may be capable of producing a finite number of unique phase states, which may be dependent on the number of phase bits of controlling the active vector generator. As previously described, the vector generator may receive an input signal and generate a phase adjusted composite vector. The composite vector is a combination of an I vector and a Q vector. In various embodiments, the amplitude of the composite vector may be the same in each of the unique phase states.

As illustrated in FIG. 3, the phase states may be divided into quadrants and octants. Inverter switches 152, 153 control the quadrant selection of the resultant composite vector. Specifically, inverter switches 152, 153 control whether the I and Q vector components have a positive value or a negative value. As is understood by one skilled in the art and by way of example, if both the I and Q vector components have positive values, the resultant composite vector is in the first quadrant (+1, +1). Similarly, if both the I and Q vector components have negative values, the resultant composite vector is in the third quadrant (−1, −1).

Furthermore, octant selection may be controlled by vector component switch 157. By switching which of first or second amplitude adjustment components 154, 155 the respective signals are communicated to, vector component switch 157 may control the octant of the resultant vector component. The amplitudes used for the I vector component may be created over a phase range from 0-45° with one amplitude adjustment component and amplitudes used for the I vector component over the phase range from 45-90° may be created with a second amplitude adjustment component. Vector component switch 157 may be used to route the I and Q vector components to the correct amplitude adjustment components 154, 155 depending on the octant of the desired phase rotation.

In comparison to vector generator 100, all of the same phase states are obtainable in active vector generator 150 by inverting the I and Q vector components based on the vector component with greater magnitude due to octal symmetry. Since at least one of the amplitude adjustment components has a decrease in the dynamic range and does not need full amplitude output capabilities, then at least one amplitude adjustment component may have a reduced design. In other words, a benefit of having two amplitude adjustment components with selectable signal pathways is that all the phase states may be obtained by using less robust and expensive amplitude adjustment components. As previously described, one of the amplitude adjustment components may have full or higher range amplitude capabilities and the other amplitude adjustment component may have partial or lower range amplitude capabilities. A decrease in dynamic range of one or more amplitude adjustment components may reduce the number of attenuators or current sources by a factor of two.

For example, first amplitude adjustment component 154 may have a high partial range of amplitude control, such as from $$\frac{\sqrt{2}}{2}$$

to 1 and second amplitude adjustment component 155 may have a low partial range of amplitude control, such as 0 to $$\frac{\sqrt{2}}{2}.$$

In this example, assume 360° is broken into thirty-two phase states. Each quadrant would contain eight phase states. In a prior art example, the eight phase states would require first full amplitude adjustment VGA 104 and second full amplitude adjustment VGA 105 to individually have eight amplitude settings. If the prior art example were implemented with attenuators, a total of sixteen attenuators would be needed, one for each of the total amplitude settings. In the current example with a high and low range of amplitude control, first amplitude adjustment component 154 may have four amplitude settings and second amplitude adjustment component 155 may have the other four amplitude settings. If the current example were implemented with attenuators, the design may comprise a total of eight attenuators and the vector component switch, one for each of the total amplitude settings. Thus, the total number of attenuators may be reduced as compared to a prior art configuration without the two different capacity amplitude adjustment components and switching.

Figure 4:
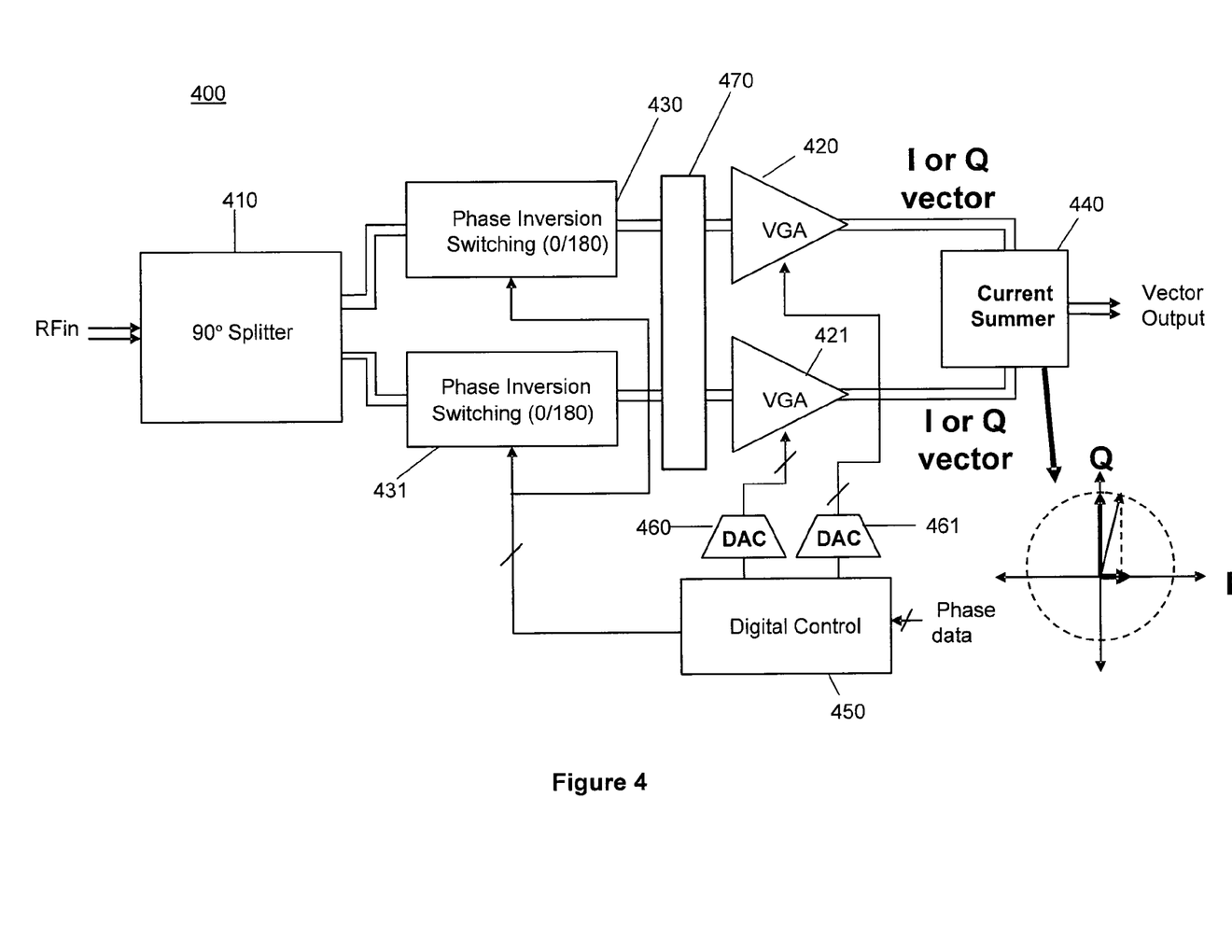
FIG. 4 illustrates an example of an active vector generator embodiment.

With reference to FIG. 4, various embodiments of an active vector generator 400 may comprise a 90° splitter 410, a first VGA 420 and a second VGA 421, a first inverter switch 430 and a second inverter switch 431 each configured for phase inversion switching, and a vector component switch 470. The first inverter switch 430 may be in communication with 90° splitter 410 and vector component switch 470. Vector component switch 470 may transmit a first signal to first VGA 420. The second inverter switch 431 may be also in communication with 90° splitter 410 and vector component switch 470. Vector component switch 470 may transmit a second signal to second VGA 421. Moreover, active vector generator 400 may further comprise a current summer 440 that may be configured to receive a first VGA output signal from first VGA 420 and a second VGA output signal from second VGA 421. Current summer 440 may combine the first and second VGA output signals and generate a composite vector output. Furthermore, in various embodiments, active vector generator 400 may comprise a digital controller 450 that controls a first digital-to-analog converter (DAC) 460 and a second DAC 461. The first and second DACs 460, 461 may control first and second VGAs 421, 420, respectively. Additionally, digital controller 450 may control first and second inverter switches 430, 431.

In various embodiments, active vector generator 400 may control the phase and amplitude of an RF signal by splitting the RF signal into two separate vectors, the in-phase (I) vector and the quadrature-phase (Q) vector. The I vector and Q vector may be processed in parallel, each passing through the phase inverting switching performed by first and second inverter switches 430, 431. Vector component switch 470 may receive a signal from first inverter switch 430 and another signal from second inverter switch 431. Based on whether the I or Q vector is desired to have a greater magnitude, vector component switch 470 routes the signals to the appropriate VGAs 420, 421. The resultant outputs of phase inverting switches 430, 431 comprise four possible signals: a non-inverted I, an inverted I, a non-inverted Q, and an inverted Q. Furthermore, vector component switch 470 may enable selection of a specific octant by selecting the signal routes to VGAs 420, 421. In this manner, all eight octants of a phasor diagram are available for further processing by VGAs 420, 421. In various embodiments, two of the eight possible signals may be processed respectively through VGAs 420, 421, until the two selected signals are combined in current summer 440 to form a resultant vector component. The current summer 440 may output the resultant vector component with phase and amplitude adjustments. In various embodiments, the composite RF signal may be in differential signal form. The differential RF signal communication may be throughout vector generator 400 or limited to various portions of vector generator 400. In other embodiments, the composite RF signals may be in single-ended form.

In various embodiments, control for the quadrant shifting and VGA functions may be provided by a pair of DACs 460, 461. Reconfiguration of digital controller 450 may allow the number of phase bits to be digitally controlled after vector generator 400 is fabricated if adequate DAC resolution and automatic gain control (AGC) dynamic range exists. In various embodiments with adequate DAC resolution and AGC dynamic range, suitable desired vector phase and amplitude can be produced with selectable fine quantization steps using digital control. In other embodiments, reconfiguration of DACs 460, 461 can be made after vector generator 400 is fabricated in order to facilitate adjustment of the vector amplitudes.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

The invention claimed is:

1. An active vector generator comprising:
   a 90° splitter configured to receive an input signal and to output two signals with a relative 90° phase difference;

a first inverter switch in parallel with a second inverter switch;

a vector component switch;

a first amplitude adjustment component in parallel with a second amplitude adjustment component; and a combiner configured to receive two signals and generate a phase-adjusted resultant composite vector;

wherein the first and second inverter switches, the vector component switch, and the first and second amplitude adjustment components are electrically connected between the 90° splitter and the combiner, wherein each of the first inverter switch and the second inverter switch are configured to invert a signal based on a desired quadrant of the phase-adjusted resultant composite vector;

wherein the active vector generator is configured to adjust the phase of the input signal and generate the phase-adjusted resultant composite vector;

wherein the first amplitude adjustment component has a high range of amplitude capability, and wherein the second amplitude adjustment component has a low range of amplitude capability; and wherein the high range of amplitude capability of the first amplitude adjustment component is $$\frac{\sqrt{2}}{2}$$

to 1, and wherein the low range of amplitude capability of the second amplitude adjustment component is 0 to $$\frac{\sqrt{2}}{2}.$$

2. The active vector generator of claim 1, wherein the vector component switch is configured to receive a first inverter output signal from the first inverter switch and a second inverter output signal from the second inverter switch; and wherein the vector component switch is configured to transmit one of the first and second inverter output signals to the first amplitude adjustment component and further configured to transmit the remaining of the first and second inverter output signals to the second amplitude adjustment component.

3. The active vector generator of claim 1, wherein the first inverter switch receives a first signal from the vector component switch and the second inverter switch receives a second signal from the vector component switch;

wherein the first inverter switch is configured to transmit a first output signal to the first amplitude adjustment component; and wherein the second inverter switch is configured to transmit a second output signal to the second amplitude adjustment component.

4. The active vector generator of claim 1, wherein the first amplitude adjustment component is configured to receive a first signal from the first inverter switch; and wherein the second amplitude adjustment component is configured to receive a second signal from the second inverter switch; and wherein the first amplitude adjustment component transmits a first output signal to the vector component switch and wherein the second amplitude adjustment component transmits a second output signal to the vector component switch.

5. The active vector generator of claim 1, wherein each of the first inverter switch and the second inverter switch is a 180° switch.

6. The active vector generator of claim 2, wherein the vector component switch is configured to route the first inverter output signal to either the first amplitude adjustment component or the second amplitude adjustment component;

wherein the vector component switch is configured to route the second inverter output signal to the first amplitude adjustment component or the second amplitude adjustment component that does not receive the first inverter output signal; and wherein a determination of the route of the first inverter output signal and the route of the second inverter output signal is based on the relative magnitudes of the first inverter output signal and the second inverter output signal.

7. The active vector generator of claim 2, wherein the vector component switch is configured to route the first inverter output signal to either the first amplitude adjustment component or the second amplitude adjustment component;

wherein the vector component switch is configured to route the second inverter output signal to the first amplitude adjustment component or the second amplitude adjustment component that does not receive the first inverter output signal; and wherein a determination of the route of the first inverter output signal and the route of the second inverter output signal is based on a desired phase shift to be applied by the active vector generator.

8. A method of phase adjustment by an active vector generator, the method comprising:

controlling, by a vector component switch, an octant selection of a resultant composite vector by routing a first signal and a second signal based on the magnitudes of the first signal and the second signal relative to one another;

adjusting, by a first amplitude adjustment component, an amplitude of a first vector component received from the vector component switch and transmitting an amplitude adjusted first vector component; and adjusting, by a second amplitude adjustment component, an amplitude of a second vector component received from the vector component switch and transmitting an amplitude adjusted second vector component, wherein the first amplitude adjustment component is in parallel with the second amplitude adjustment component;

wherein the first signal, if within a phase range from 0-45°, is created by the first amplitude adjustment component; and wherein the first signal, if within a phase range from 45-90°, is created by the second amplitude adjustment component.

9. The method of claim 8, further comprising:

receiving, at a 90° splitter, an input signal and generating a first splitter output signal and a second splitter output signal, wherein the second splitter output signal has a 90° phase difference relative to the first splitter output signal.

10. The method of claim 9, further comprising:

receiving, at a first inverter switch, the first splitter output signal; and receiving, at a second inverter switch, the second splitter output signal, wherein the first and second inverter switches are configured to control the octant selection of the resultant composite vector of the active vector generator;

wherein the first inverter switch transmits the first signal and the second inverter switch transmits the second signal to the vector component switch.

11. The method of claim 10, further comprising:
combining, by a combiner, the amplitude adjusted first vector component and the amplitude adjusted second vector component to generate the resultant composite vector of the active vector generator.

12. A vector switching module of an active vector generator, the vector switching module comprising:
a first amplitude adjustment module in parallel with a second amplitude adjustment module, wherein the first amplitude adjustment module has a high range of amplitude capabilities, and wherein the second amplitude adjustment module has a low range of amplitude capabilities, wherein the high range of amplitude capabilities of a first amplitude adjustment component is $$\frac{\sqrt{2}}{2}$$

to 1, and wherein the low range of amplitude capabilities of a second amplitude adjustment component is 0 to $$\frac{\sqrt{2}}{2};$$

and a vector component switch configured to receive a first input signal and a second input signal, and wherein the vector component switch is configured to provide either the first or second input signal to the first amplitude adjustment module.

13. The vector switching module of claim 12, wherein the first and second amplitude adjustment modules receive, from the vector component switch, the first and second input signals, and wherein the first and second amplitude adjustment modules produce two amplitude adjusted signals; and wherein a combiner is configured to generate a resultant composite vector by combing the two amplitude adjusted signals.

* * * * *

UNITED STATES PATENT AND TRADEMARK OFFICE
CERTIFICATE OF CORRECTION

PATENT NO.         : 8,737,531 B2                    Page 1 of 1
APPLICATION NO.    : 13/306503
DATED              : May 27, 2014
INVENTOR(S)        : David R. Saunders It is certified that error appears in the above-identified patent and that said Letters Patent is hereby corrected as shown below:

In the Specification

In Column 1, lines 17-23, the sentences "Correspondingly, the in-phase component amplitude over the phase range from 0-45° is identical to the amplitudes used for the quadrature-phase component over the phase range from 90-45°." and "Similarly, the in-phase component over the range of 45-90° is identical to the amplitudes used for the quadrature-phase component over the phase range from 45-0°." after the sentence ending with the word "same" are included in error and should be removed.

In Column 1, line 42 through Column 2, line 4, the paragraph beginning with the sentence "The first and second amplitude adjustment components may operate with different ranges of amplitude." is included in error and should be removed in its entirety.

In Column 3, line 23, the text "Correspondingly, the in-phase component amplitude over the phase range from 0-45° is identical to the amplitudes used for the quadrature-phase component over the phase range from 90-45°. Similarly, the in-phase component over the range of 45-90° is identical to the amplitudes used for the quadrature-phase component over the phase range from 45-0°." after the sentence ending with the numeral "105" is excluded in error and should be added.

Signed and Sealed this
Twenty-sixth Day of May, 2015

Michelle K. Lee
*Director of the United States Patent and Trademark Office*